United States Patent
Owczarz et al.

(10) Patent No.: US 7,780,825 B2
(45) Date of Patent: Aug. 24, 2010

(54) SUBSTRATE GRIPPER WITH INTEGRATED ELECTRICAL CONTACTS

(75) Inventors: Aleksander Owczarz, San Jose, CA (US); Robert Knop, Fremont, CA (US); Mike Ravkin, Sunnyvale, CA (US); Carl A. Woods, Aptos, CA (US)

(73) Assignee: Lam Research Corporation, Fremont, CA (US)

( * ) Notice: Subject to any disclaimer, the term of this patent is extended or adjusted under 35 U.S.C. 154(b) by 735 days.

(21) Appl. No.: 11/751,536

(22) Filed: May 21, 2007

(65) Prior Publication Data

US 2008/0289967 A1  Nov. 27, 2008

(51) Int. Cl.
*C25B 9/04* (2006.01)
(52) U.S. Cl. ............... 204/297.06; 204/297.01; 204/297.07; 204/297.08; 204/297.09; 204/297.14; 29/592.1; 29/429; 29/709; 29/760; 29/823
(58) Field of Classification Search ............ 204/297.01, 204/297.06, 297.07, 297.08, 297.09, 297.1, 204/297.14; 29/592.1, 429, 709, 760, 822, 29/823
See application file for complete search history.

(56) References Cited

U.S. PATENT DOCUMENTS

2002/0174881 A1 * 11/2002 Bliven et al. ................... 134/6

FOREIGN PATENT DOCUMENTS

| JP | 2000-031145 | 1/2000 |
|----|-------------|--------|
| JP | 2005-191368 | 7/2005 |
| JP | 2007-050505 | 3/2007 |
| KR | 10-2004-0104592 | 10/2004 |

OTHER PUBLICATIONS

Kajita Akihiro et al, Manufacture of semiconductor device, Jan. 28, 2000, English Translation of JP2000-031145, Detailed Description pp. 1-7, Description of Drawings pp. 1-2 and Drawings pp. 1-3.*

* cited by examiner

*Primary Examiner*—Bruce F Bell
(74) *Attorney, Agent, or Firm*—Martine Penilla & Gencarella, LLP

(57) ABSTRACT

A substrate holding and transporting assembly is disclosed. The substrate holding and transporting assembly includes a base plate and a pair of clamps connected to the base plate in a spaced apart orientation, the spaced apart orientation of the pair of clamps enable support of a substrate with at least two independent points. The substrate holding and transporting assembly also includes an electrode assembly connected to the base plate at a location that is substantially between the pair of clamps. The electrode assembly defined to impart an electrical contact to the substrate when present and held by the pair of clamps.

20 Claims, 15 Drawing Sheets

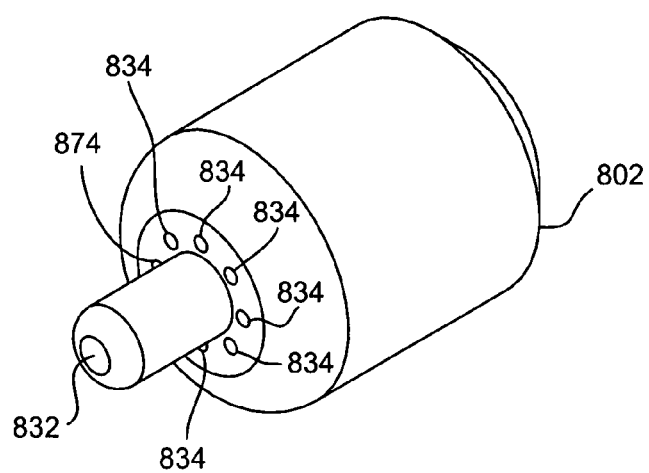
FIG. 8C
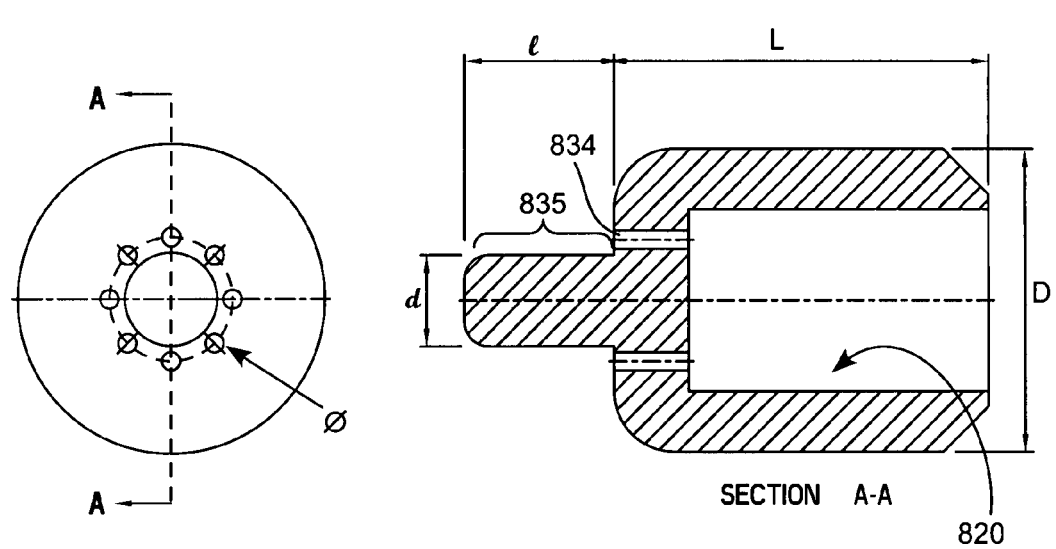
SECTION A-A

FIG. 9
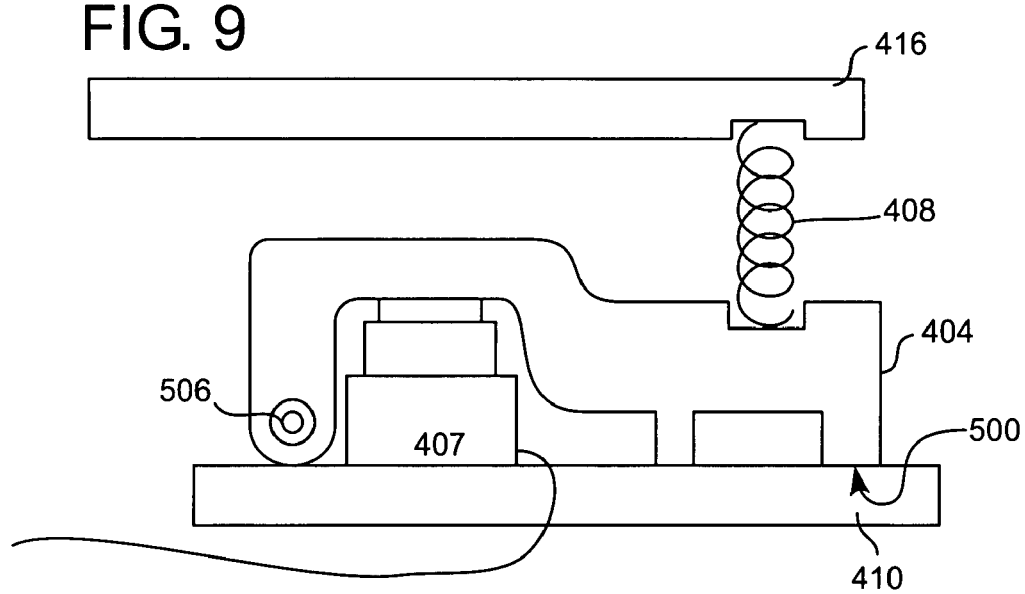
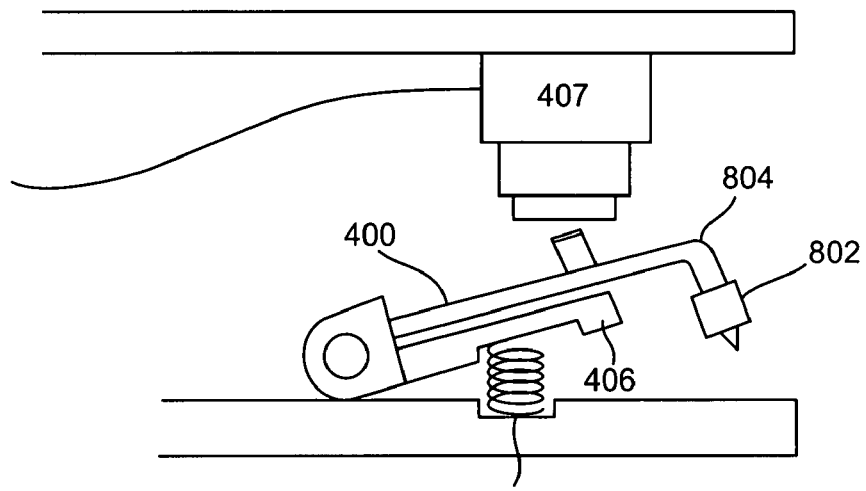
FIG. 10

SUBSTRATE GRIPPER WITH INTEGRATED ELECTRICAL CONTACTS

CROSS REFERENCE TO RELATED APPLICATION

This application is related to application Ser. No. 11/539,611, entitled, PROXIMITY PROCESSING USING CONTROLLED BATCH VOLUME WITH AN INTEGRATED PROXIMITY HEAD, filed on Oct. 6, 2006, which is herein incorporated by reference.

BACKGROUND OF THE INVENTION

1. Field of the Invention

The present invention relates generally to handling of substrates and more specifically, the simultaneous movement of substrates through process heads while applying an electrical contact.

2. Description of the Related Art

Semiconductor substrate processing may include various process operations including, but not limited to, etching, deposition, cleaning and polishing. One method to perform a deposition process is to use electroplating. The electroplating process requires electrical contact to be made with the substrate as it is exposed to an electroplating process fluid. Various methods can be used to perform electroplating however it can be difficult to achieve consistent plating over the entire substrate because the electrical contact can interfere with the plating process. For example, one method of electroplating submerges a substrate in a tank of electroplating fluid. Electrical contact can be made with the substrate using a plurality of electrical contacts submerged in the tank. However, irregularities in the deposition of plating material can occur wherever electrical contact is made with the substrate.

In view of the forgoing, there is a need for improved substrate handling that can provide highly reliable electrical contact in an electroplating environment while minimizing irregularities in the deposition of plating material.

SUMMARY

In one embodiment, a substrate holding and transporting assembly is disclosed. The substrate holding and transporting assembly includes a base plate and a pair of clamps connected to the base plate in a spaced apart orientation. The spaced apart orientation can be defined to enable support of a substrate with at least two independent points, the two independent points defined by the pair of clamps. The substrate holding and transporting assembly also includes an electrode assembly being connected to the base plate at a location that is substantially between the pair of clamps. The electrode assembly defined to impart an electrical contact to the substrate when present and held by the pair of clamps.

In another embodiment, a method for clamping and applying an electrical contact to a substrate is disclosed. The method includes providing a clamping assembly having an integrated electrode assembly in a receiving position capable of being independently actuated into a closed position. The clamping assembly also has at least two substrate clamps in a receiving position, the substrate clamps capable of being independently actuated into a clamped position. In another operation, the method receives the substrate at the clamping assembly and actuates the substrate clamps into the clamped position. The clamped position placing the substrate clamps in contact with the substrate. In another operation, the electrode assembly is actuated into a closed positioned, the closed position of the electrode assembly placing a plurality of electrodes in contact with the substrate. Wherein the plurality of electrodes that are in contact with the substrate apply the electrical contact.

In yet another embodiment, a substrate handling assembly is disclosed. The substrate handling assembly includes, a base plate and a first substrate clamp coupled to the base plate. The first substrate clamps has a clamping face configured to hold and accommodate a substrate, when provided. The first substrate clamp also has an open position and a closed position, the closed position being defined to secure the substrate. The substrate handling assembly also includes a second substrate clamp coupled to the base plate also having a clamping face configured to hold and accommodate a substrate, when provided. The second substrate clamp spaced apart by a clamping distance from the first substrate clamp along the base plate to define support for the substrate. The second substrate clamp having an open position and a closed position, the closed position being defined to secure the substrate. The substrate handling assembly also includes an electrode assembly connected to the base plate at a location that is substantially between the first and second substrate clamps. The electrode assembly having a plurality of electrodes that have an open position and a closed position. The closed position being defined to transition the plurality of electrodes toward the base plate and in contact with the substrate when present.

Other aspects and advantages of the invention will become apparent from the following detailed description, taken in conjunction with the accompanying drawings, illustrating by way of example the principles of the invention.

BRIEF DESCRIPTION OF THE DRAWINGS

The invention, together with further advantages thereof, may best be understood by reference to the following description taken in conjunction with the accompanying drawings.

FIG. 8C is an exemplary schematic of an electrode diffuser in accordance with one embodiment of the present invention.

FIG. 9 is a schematic illustrating a side view of a substrate clamp assembly installed in a gripper assembly in accordance with one embodiment of the present invention.

FIG. 10 is a schematic illustrating a side of an electrode assembly installed in a gripper assembly in accordance with one embodiment of the present invention.

DETAILED DESCRIPTION

An invention is disclosed for holding and transporting a substrate. The holding and transporting of substrates can affect the rate and yield of a given semiconductor substrate process. The ability to hold and transport a substrate with minimal interference with a variety of processes applied using proximity heads can reduce potential sources of contamination thereby increasing yields. Furthermore, process rates can be increased by integrating multiple processes such as plating and cleaning within a single proximity head. However, it can be difficult to integrate a cleaning process if a substrate transport device is in constant contact with the substrate.

One embodiment of a holding and transport system for a substrate uses two grippers to hold and move the substrate into a proximity head. Initially in this embodiment, a first gripper picks up the substrate in an exclusion zone along the edge of the substrate. The first gripper transports the substrate into the proximity head and only the substrate is exposed to the process chemistry. As the substrate emerges from the proximity head, a second gripper is in position to receive the now processed substrate. In one embodiment, a handoff of the substrate between the first gripper and second gripper occurs after the second gripper clamps down on the substrate. In the following description, numerous specific details are set forth in order to provide a thorough understanding of the present invention. It will be apparent, however, to one skilled in the art that the present invention may be practiced without some or all of these specific details. In other instances, well known process steps have not been described in detail in order not to unnecessarily obscure the present invention.

Figure 1:
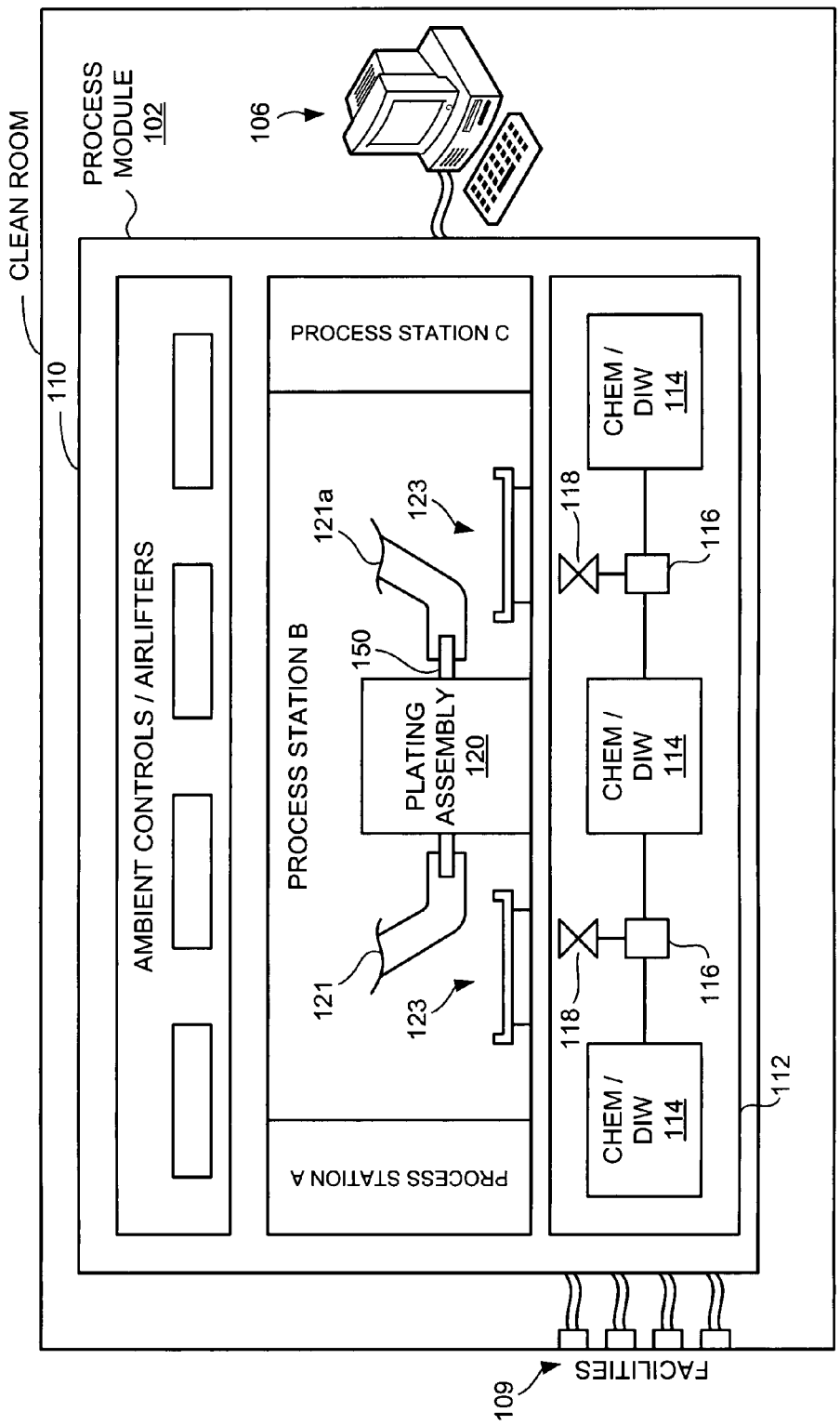
FIG. 1 is a high level schematic of a process module 102 in accordance with one embodiment of the present invention.

FIG. 1 is a high level schematic of a process module 102 in accordance with one embodiment of the present invention. In this embodiment, the process module 102 is located in a clean room 108 and connected to computer 106. Computer 106 can provide direct control and monitoring of the processes performed in process module 102. Additionally, attaching computer 106 to a computer network can provide remote control and monitoring of the process module 102. The clean room 108 can provide facilities 109 capable of supplying and removing process fluids from the process module 102. Fluid controls 112 can store the process fluids supplied by the facilities 109. Flow from process chemical or de-ionzied water storage 114 can be controlled using flow controllers 116 and valves 118.

Process module 102 can include ambient controls 110 that can include, but are not limited to, air filters, heaters, humidifying devices and dehumidifying devices. Also found in process module 102 are various process stations. Process module 102 includes process stations A, B, and C and is intended to be exemplary as it would be possible to have a processes module with fewer or additional process stations. Process station B includes gripper assembly 121 and gripper assembly 121a, plating assembly 120 and substrate handlers 123. In one embodiment, the gripper assembly 121 is positioned to clamp and move a substrate 150 from the substrate handler 123 into the plating assembly 120. Note that alternate and additional processes other than plating can be performed. Also note that processes performed by a process station can performed by a single or multiple proximity process heads.

As the substrate 150 emerges from the plating assembly 120, the gripper assembly 121a is positioned to receive the substrate 150. When an appropriate amount of the substrate 150 has emerged from the plating assembly 150, the gripper assembly 121a can clamp onto the substrate 150 and pull the substrate 150 through the plating assembly. In one embodiment, gripper assembly 121 continues to push the substrate 150. In order to pass the substrate 150 through the plating assembly 120, the gripper 121 releases the substrate 150 and the gripper 121a continues to pull the substrate 150. In other embodiments, process station B can include a variety of processing assemblies and proximity heads other than, and in addition to, the plating assembly 120. Similarly, process stations A and C can accommodate and facilitate a variety of process assemblies.

Figure 2:
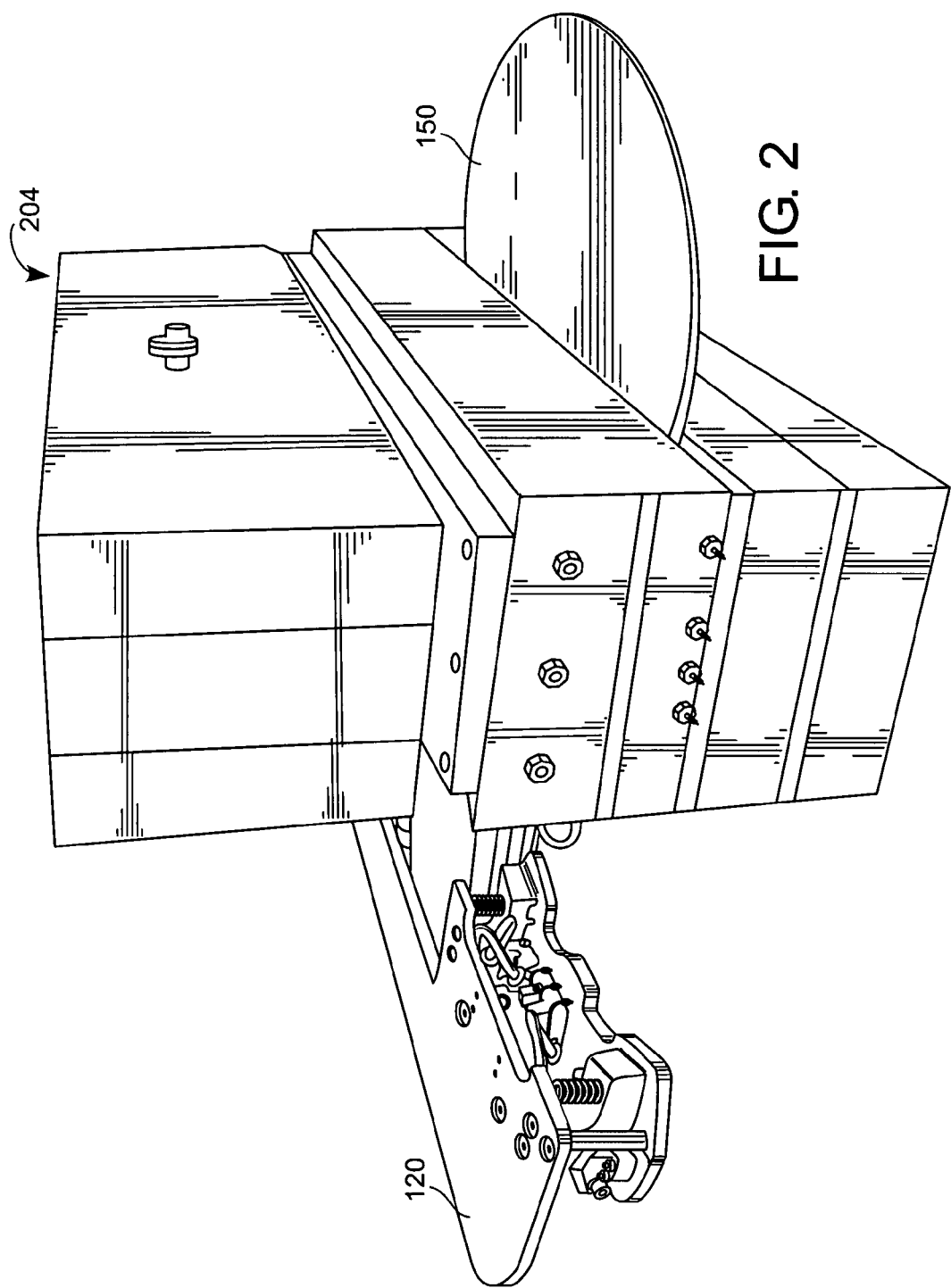
FIG. 2 is a overview schematic of a gripper assembly in relation to a process station and substrate, in accordance with one embodiment of the present invention.

FIG. 2 is a overview schematic of a gripper assembly 121 in relation to a process station 204 and substrate 150, in accordance with one embodiment of the present invention. As illustrated and described above, the gripper assembly 121 has released the substrate 150. In this embodiment, the substrate 150 has emerged from the process station 204, and for clarity, the second gripper that would be pulling the substrate is not shown. In a scenario where the process station 204 performed a electroplating operation, the gripper assembly 121 and the second gripper are configured to secure the substrate using substrate clamps and apply and electrical charge with an electrode assembly that is integrated into the gripper assembly.

Figure 3:
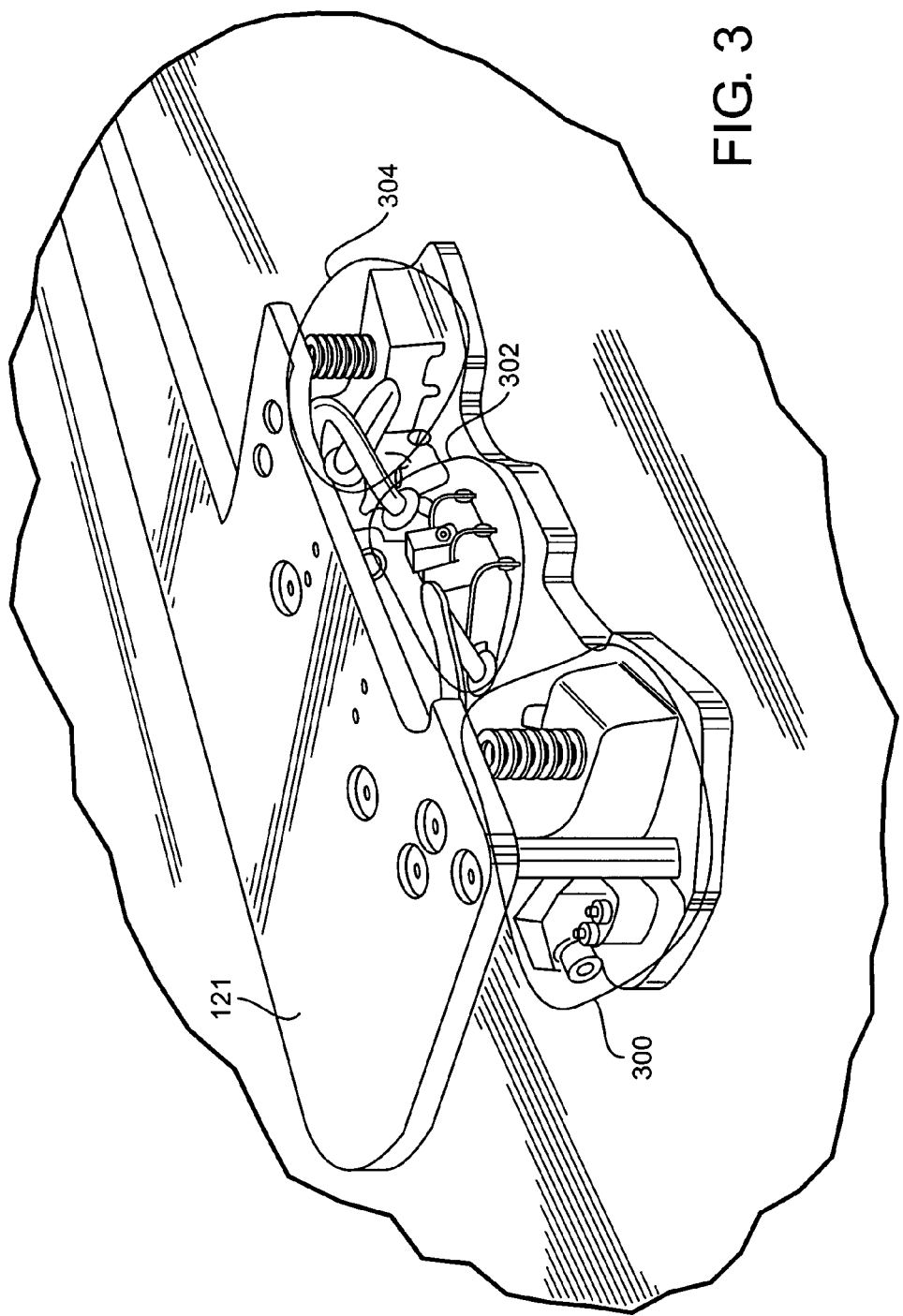
FIG. 3 is a schematic illustrating a close up view of a gripper assembly in accordance with one embodiment of the present invention.

FIG. 3 is a schematic illustrating a close up view of a gripper assembly 121 in accordance with one embodiment of the present invention. For discussion purposes, the gripper assembly 121 can be broken down into the following three subassemblies: clamp assembly 300, electrode assembly 302 and clamp assembly 304. Other embodiments of the gripper assembly can include a single clamp assembly or additional clamp assemblies. Similarly, additional electrode assemblies can be included in alternate embodiments of the gripper assembly 121. In the embodiment shown in FIG. 3, the clamp assemblies 300 and 304 are shown in a closed positioned even though a substrate is not present. Furthermore, the electrode assembly 302 is shown in an open position. In other embodiments, the clamp assemblies can be in an open position and the electrode assembly can be in a closed position when a substrate is not present.

In one embodiment, the gripper assembly 121 approaches a stationary substrate with clamp assemblies 300 and 304 in a closed position and the electrode assembly 302 in an open position. As the gripper assembly 121 approaches the substrate, the clamp assemblies 300 and 304 can be actuated into an open position. When the gripper assembly 121 is properly positioned about the substrate, the clamp assemblies 300 and 304 can be closed on the appropriate areas of the substrate. In one embodiment, the appropriate areas of the substrate include an exclusion zone at the edge of the substrate. When actuated to close, the substrate clamp assemblies 300 and 304 secure the substrate to the gripper assembly 121. In one embodiment, the clamp assemblies 300 can move independently from clamp assembly 304. This can allow clamp assembly 300 to close on the substrate first, followed by clamp assembly 304, or vice versa. In other embodiments, actuation of the independent clamp assemblies 300 and 304 occurs simultaneously.

After the clamp assemblies 300 and 304 have secured the substrate, electrode assembly 302 can be actuated to a closed position placing electrodes in contact with the substrate. In one embodiment, the electrodes contact the substrate in the exclusion zone at the edge of the substrate. Note that the electrode assembly 302 can be selectively applied to the substrate. This can be beneficial as gripper assemblies 121 can transport substrates through process modules that do not require the application of electrodes. In other embodiments, the gripper assembly 121 can be fabricated as modular components permitting the rapid addition, removal or replacement of an electrode assembly 302, or clamp assembly 300 or 304 as needed. Other embodiments can allows the electrode assembly to be swapped out for an additional clamp assembly.

Figure 4:
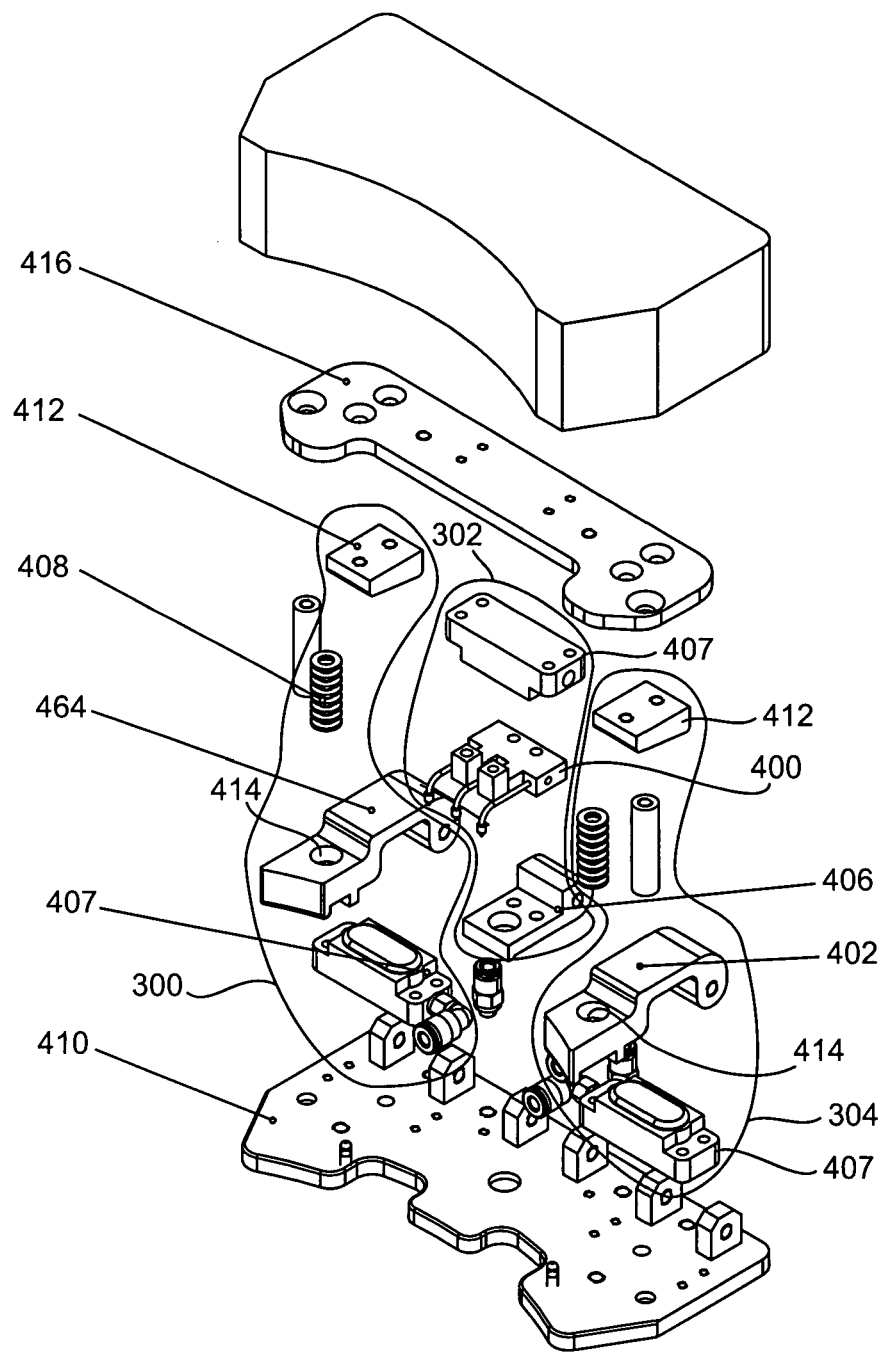
FIG. 4 is an exploded view of the gripper assembly in accordance with one embodiment of the present invention.

FIG. 4 is an exploded view of the gripper assembly 121 in accordance with one embodiment of the present invention. In one embodiment, the clamp assemblies 300 and 304 include an actuator 407, a substrate clamp 404 or substrate clamp 402, a compression module 408 and a stop block 412. In one embodiment, the substrate clamps 404 and 402 are coupled to a base 410 at a coupling point. The coupling point allows the substrate clamps 402 and 404 to pivot to an open position and a closed position. Also coupled to the based 410 are the actuators 407 that are capable of pivoting the substrate clamps 402 and 404 into an open position about the coupling point.

The substrate clamps 402 and 404 include a feature 414 to interface with the compression module 408. In the embodiment shown in FIG. 4, the feature 414 is a counterbore region to accommodate the compression module 408. Though compression module 408 is illustrated as a spring, this is intended to be exemplary as the compression module in other embodiments can be an actuator capable of providing a constant and repeatable force on the substrate clamps 402 and 404.

The stop block 412 is coupled to a top 416 and can provide an upper limit of movement for the substrate clamps 402 and 404 when moved into the open position by the actuators 407. In other embodiments, the stop blocks 412 are not required as the actuators 407 can be configured to limit a maximum distance of travel.

The electrode assembly 302 includes a contact lever 406, electrode manifold assembly 400, actuator 407, and tension module 414 (not shown). In one embodiment, the electrode manifold assembly 400 is coupled to the contact lever 406 and the contact lever 406 is coupled to the base 410. The contact lever 406 is coupled to the base at a coupling point that allows the contact lever 406 to pivot into an open position and a closed position. Additional exemplary details regarding the electrode manifold assembly 400 will be provided below in the discussion of FIGS. 8-8C. In one embodiment, the tension module 414 is positioned between the base 410 and the electrode manifold assembly 400. The tension module 414 can provide a constant force that pivots the electrode manifold assembly 400 into the open position. The actuator 407, can be coupled to the top 416 and when actuated, can lower the electrode manifold assembly 400 into the closed position. In one exemplary embodiment, the actuator 407 can be operated pneumatically while other embodiments of the actuator 407 can be operated using a variety of alternate techniques.

Figure 5:
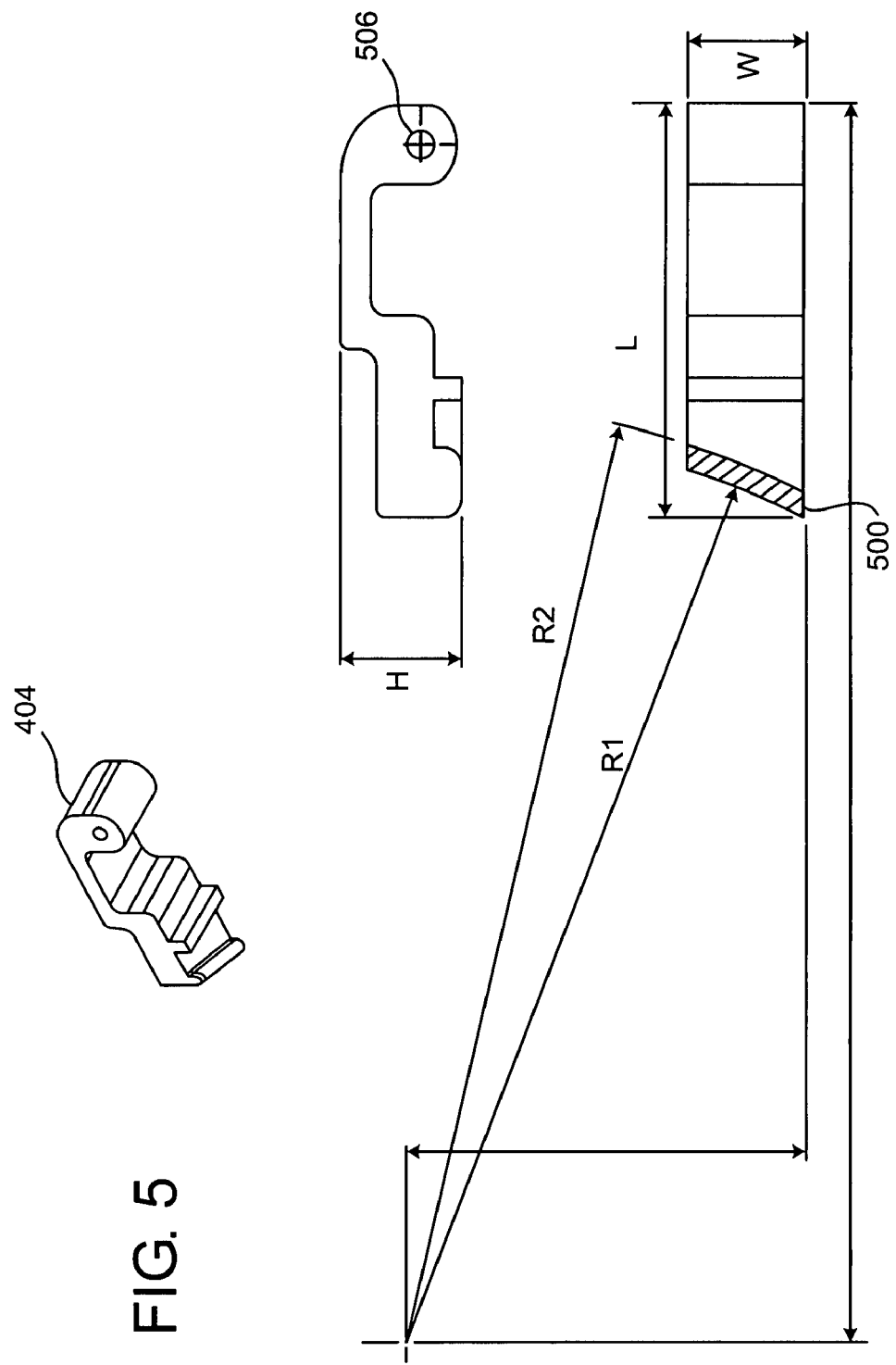
FIG. 5 and FIG. 6 are schematics of substrate clamps 402 and 404 in accordance with embodiments of the present invention.
Figure 6:
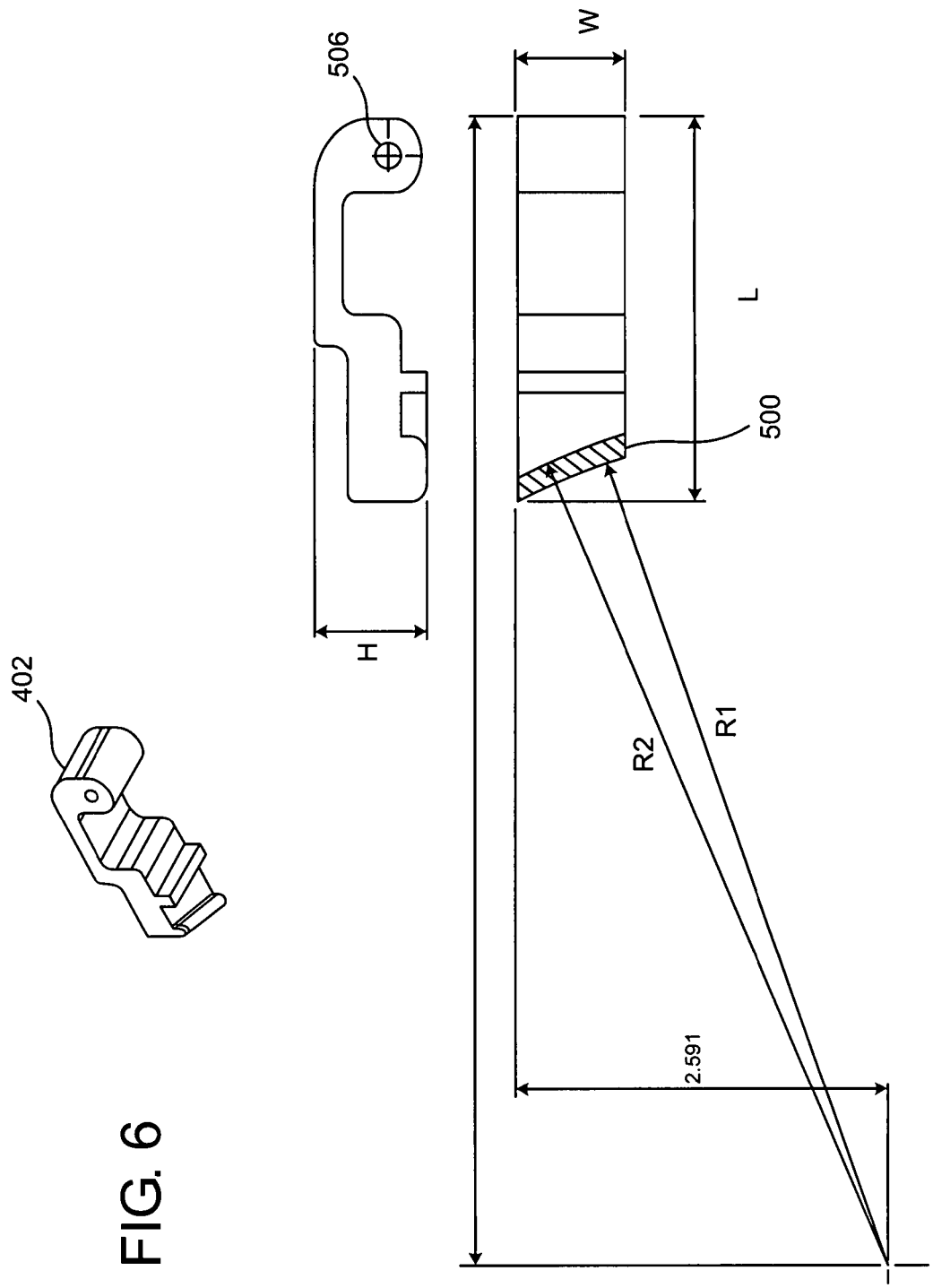

FIG. 5 and FIG. 6 are schematics of substrate clamps 402 and 404 in accordance with embodiments of the present invention. The substrate clamps 402 and 404 have a bottom side that includes a clamping surface 500. With a substrate present and the substrate clamps 402 and 404 in a closed position, the clamping surface 500 will be in contact the substrate. The substrate clamps 402 and 404 illustrated in FIGS. 5 and 6 are configured to accommodate a circular substrate having a diameter of about 300 mm. As the clamping surface 500 is intended to contact as exclusion area of the substrate, the clamping surface 500 is partially defined by two radii, R1 and R2. In one embodiment, R1 is about 145 mm and R2 is about 150 mm. Note that the listed values for R1 and R2 are exemplary for a substrate having a diameter of about 300 mm. One skilled in the art should recognize that the values of R1 and R2 could be modified in order to fabricate substrate clamps to accommodate substrates of alternate diameters. Furthermore, the use of circular substrates and the subsequent radii of the substrate clamp are not intended to be limiting. Other embodiments of substrate clamps 402 and 404 can be configured to accommodate non-circular substrates.

In one embodiment, the substrate clamps 402 and 404 can have an overall length L, of about 66 mm, a width W, of about 20 mm, and a height H, of about 20 mm. Pivot hole 506 can traverse the width of the substrate clamp 402 or 404 and provide the coupling location between the substrate clamp and the base.

Figure 7:
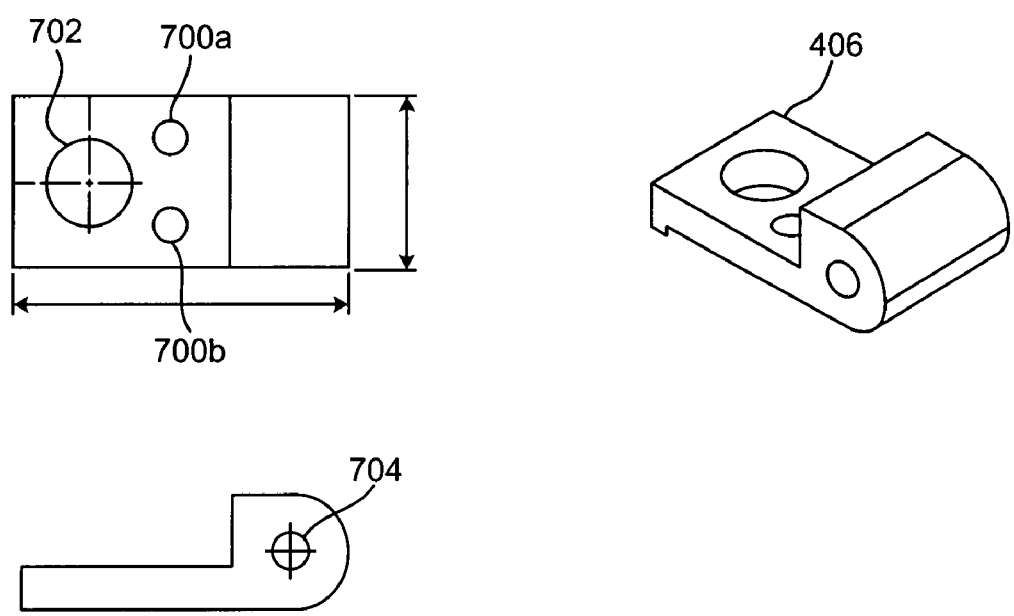
FIG. 7 is an illustration of a contact lever in accordance with one embodiment of the present invention.

FIG. 7 is an illustration of a contact lever 406 in accordance with one embodiment of the present invention. Thru hole 702 traverses the contact lever 406 and allows the tension module to be secured against a base and the electrode manifold assembly. Mounting holes 700a and 700b are defined to provide a coupling location between the electrode manifold assembly and the contact lever 406. Pivot hole 704 can traverse the width of the contact lever 406 and provide a coupling point between the contact lever 406 and the base.

Figure 8:
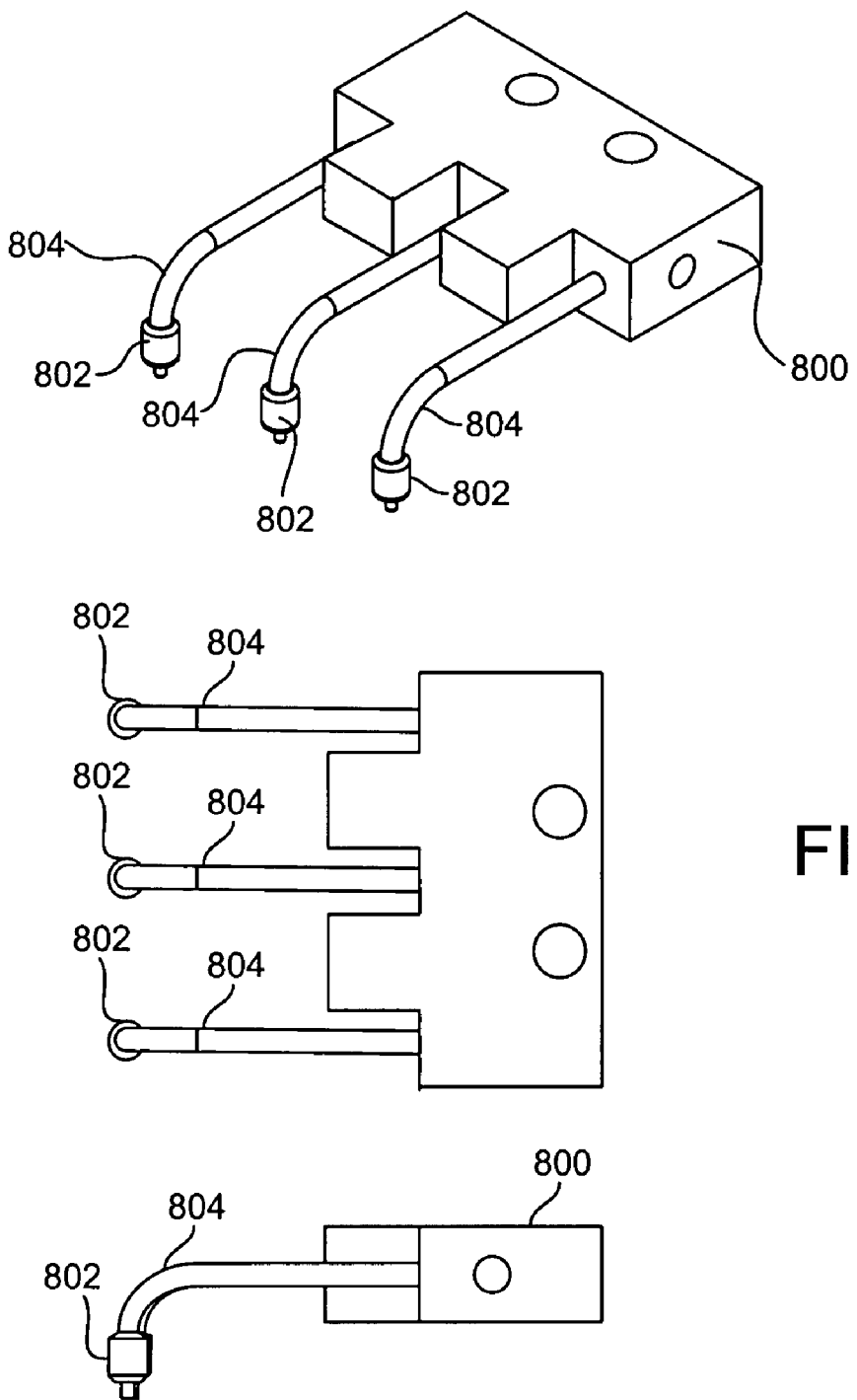
FIG. 8 is an illustration of the electrode manifold assembly in accordance with one embodiment of the present invention.

FIG. 8 is an illustration of the electrode manifold assembly 300 in accordance with one embodiment of the present invention. In one embodiment, the electrode manifold assembly 300 includes a contact manifold 800, electrode arms 804, and electrode diffusers 802. The individual components of the electrode manifold assembly 300 are discussed below.

Figure 8A:
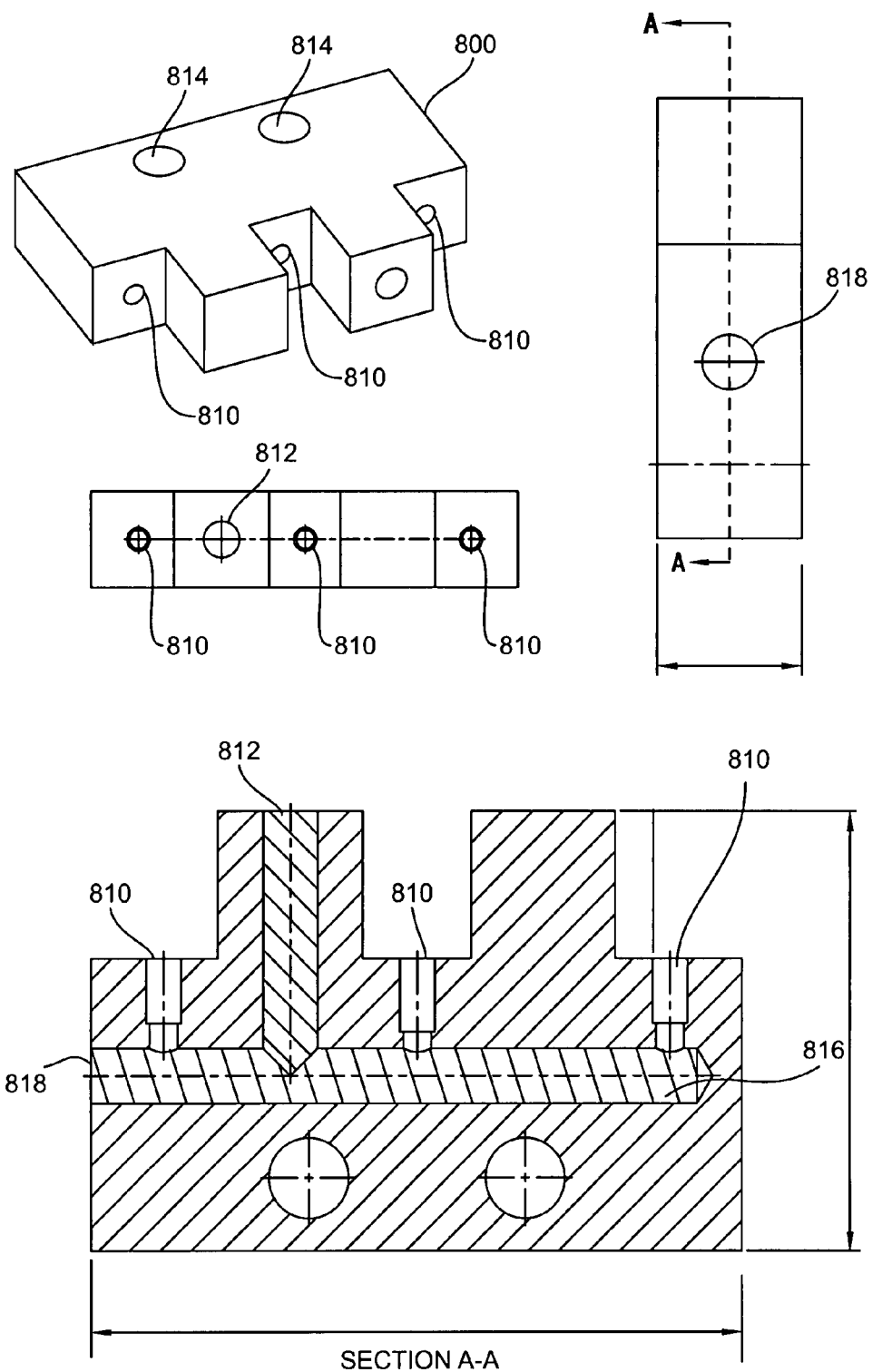
FIG. 8A is an illustration of the electrode manifold, in accordance with one embodiment of the present invention.

FIG. 8A is an illustration of the electrode manifold 800, in accordance with one embodiment of the present invention. Mounting holes 814 are positioned to provide a coupling location between the electrode manifold and the contact lever. Additionally, outlet holes 810 are positioned and sized to accommodate electrode tubes. The outlet holes 810 intersect a gas manifold 816, the gas manifold having two openings at port 812 and port 818. The gas manifold 816 allows pressurized gas that is input through either port 812 or port 818 to be distributed to the outlet holes 810.

Figure 8B:
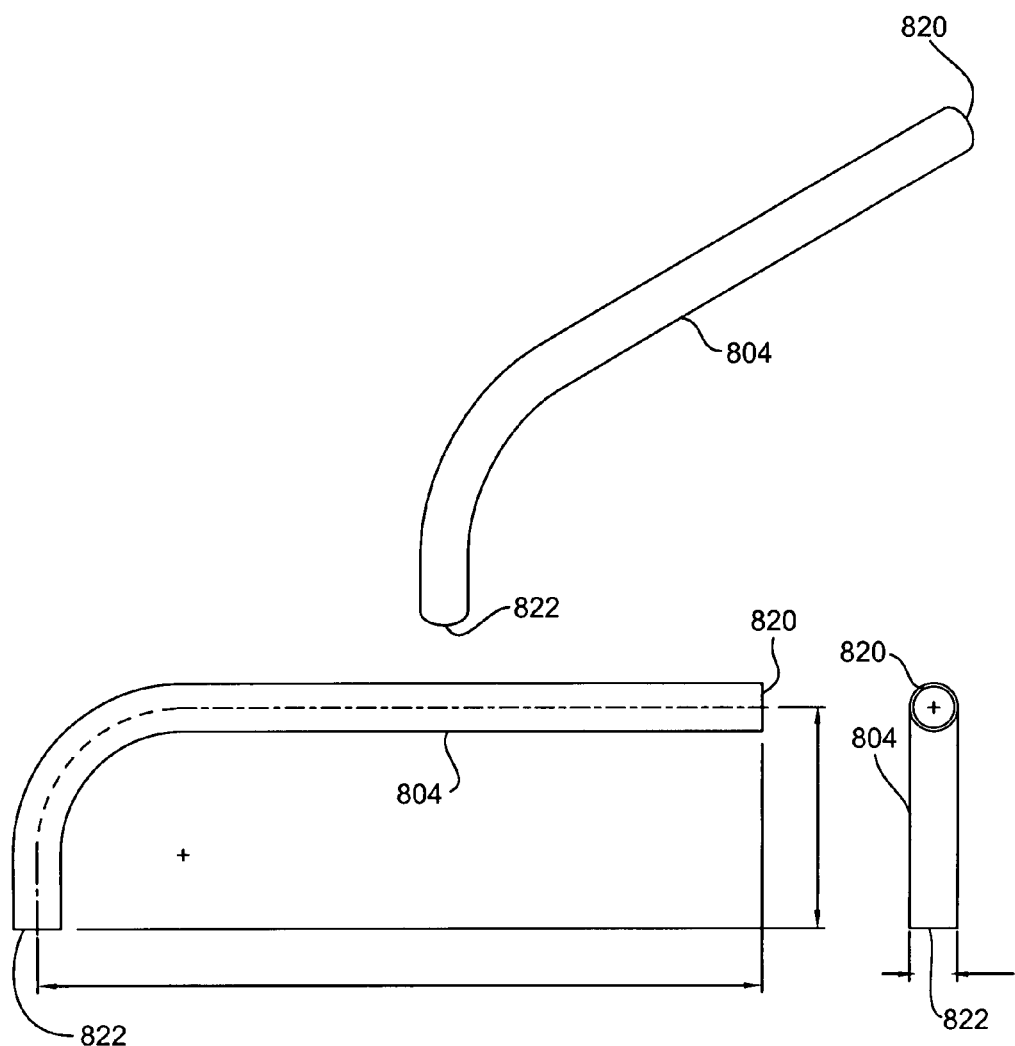
FIG. 8B is an illustration of an electrode arm 804 in accordance with one embodiment of the present invention.

FIG. 8B is an illustration of an electrode arm 804 in accordance with one embodiment of the present invention. In one embodiment, the electrode arm 804 is a hollow cylinder formed from an electrically conductive material. The electrode arm 804 has an overall length of about 23 mm, an outer diameter of about 2 mm and an inner diameter of about 1 mm. The electrode arm 804 also has a manifold end 820 and an electrode end 822. The manifold end 820 is configured to couple with the outlet hole 810 of the electrode manifold 800 while the electrode end 822 is configured to couple with the electrode diffuser 802. As pressurized gas can be transited through the hollow of the electrode arm 804, the couplings between the manifold end 820 and the electrode manifold 800 can be substantially airtight. Similarly, the coupling between the electrode end 822 and the electrode diffuser 802 can also be substantially airtight. The embodiments described above are exemplary and should not be considered limiting as the electrode arm 804 can be constructed from a variety of materials having a variety of cross-sectional profiles. For example, other embodiments of the electrode arm 804 can be constructed from tubing with a triangular, square, pentagonal, hexagonal, etc. cross-section.

FIG. 8C is an exemplary schematic of an electrode diffuser 802 in accordance with one embodiment of the present invention. The electrode diffuser 802 can be made from an electrically conductive material and be substantially cylindrical with the largest diameter D, measuring about 3 mm. In one embodiment, the electrode diffuser 802 has an overall length L, of about 3 mm. A first end of the electrode diffuser 802 has a coupling cavity 830 configured to mate with the electrode end of the electrode tube. On a second end, the end opposite from coupling cavity 830, there are a plurality of holes 834 that traverse from the second end through to the coupling cavity. The holes 834 can act to diffuse compressed gas transited through the electrode arms toward the substrate.

The electrode tip 835 is axially aligned with the electrode diffuser and extends from the second end of the electrode diffuser 802. The electrode tip 835 can have a contact surface 832 that is substantially cylindrical with a diameter d, of about 0.8 mm. Furthermore, the contact surface 832 can be offset from the second end of the electrode diffuser 802 by about 1 mm. When the electrode assembly 400 placed in the closed position, an electrical charge can be applied to the electrode assembly 400. The electrical charge can travels across the electrically conductive electrode arm 804 to the substrate via the electrode tip 802. Concurrently with the application of electrical charge, compressed gas can be delivered through the hollow of the electrode arm 804 and applied to the substrate through the diffuser 802. The application of compressed gas can disperse heat generated from the flow of electrical charge between the electrode tip and the substrate.

FIG. 9 is a schematic illustrating a side view of a substrate clamp assembly installed in a gripper assembly in accordance with one embodiment of the present invention. In this embodiment, the compression module 408 is a spring that applies a constant force to the substrate clamp 404 resulting in the substrate clamp 404 defaulting to a closed position. To open the substrate clamp 404, the actuator 407 pushes the substrate clamp 404 which pivots the substrate clamp 404 about the coupling point 506 and lifts the clamping surface 500.

FIG. 10 is a schematic illustrating a side of an electrode assembly installed in a gripper assembly in accordance with one embodiment of the present invention. In this embodiment, the tension module 414 is a spring that can apply a constant force to the electrode manifold 400 resulting in the electrode assembly defaulting to an open position. To place the electrode assembly in a closed position, the actuator 407 pushes down on the electrode assembly thereby lowering the electrode tips into contact with the substrate. Note that as the electrode tips come into contact with the substrate, the electrode arms 804 can flex providing a spring effect to facilitate a highly reliable electrical contact with the substrate.

Figures 11A, 11B:
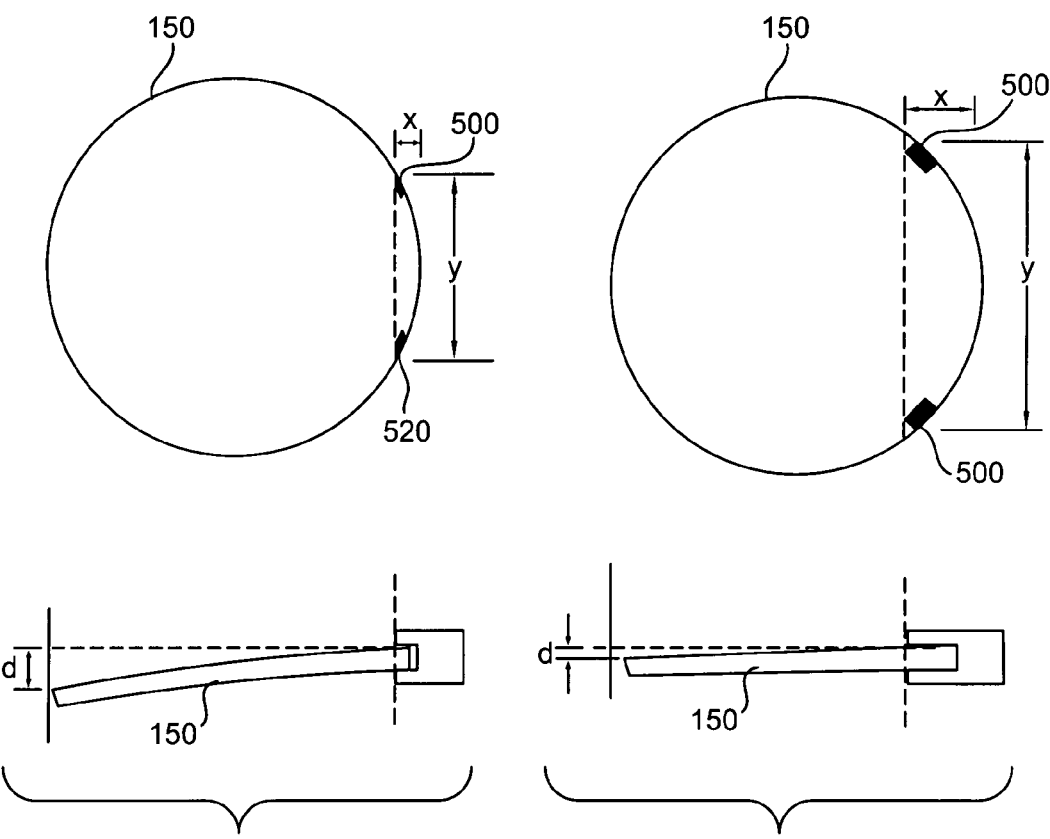
FIG. 11A and FIG. 11B are schematics illustrating various clamping distances, and comparative deflections of the substrate, in accordance with embodiments of the present invention.

FIG. 11A and FIG. 11B are schematics illustrating various clamping distances, and comparative deflections of the substrate 150, in accordance with embodiments of the present invention. In one embodiment, a single gripper assembly initially holds a substrate 150 in two substrate clamps separated by a clamping distance. The clamping distance can be defined as a distance X from the edge of the substrate 150. Alternately, the clamping distance can be defined as a distance Y between the clamping areas 500.

Regardless of the clamping distance, once held in place by the substrate clamps, the substrate 150 can act as a cantilevered member. As illustrated in FIGS. 11a and 11b, the mass of the substrate 150 can create a moment arm with a fulcrum located approximately where the substrate clamps are contacting the substrate 150. This moment arm can result in the substrate 150 deflecting a distance d. Note that the deflection d illustrated in FIGS. 11A and 11B is exaggerated for illustrative purposes. Commensurate with deflection d, is the induction of stress and strain within the substrate 150. Thus, the clamping distance, and the subsequent deflection of the substrate 150, can be partially constrained by the sensitivity of the substrate 150 to stress and strain. Another possible constraint on the clamping distance is the width of a process assembly. A wide process assembly may necessitate a smaller clamping distance as a majority of the substrate may be contained within the process assembly. Conversely, a narrow process assembly may permit a larger clamping distance.

Figure 12A:
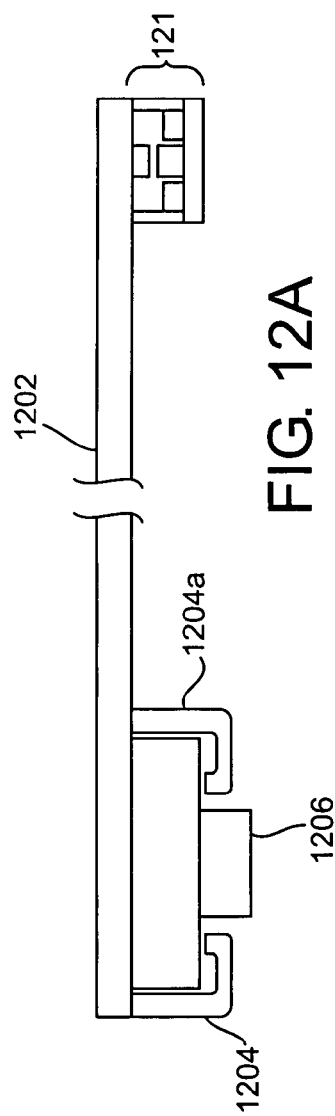
FIG. 12A and FIG. 12B are schematic illustrations of a transport system for moving the gripper assemblies in accordance with one embodiment of the present invention.
Figure 12B:
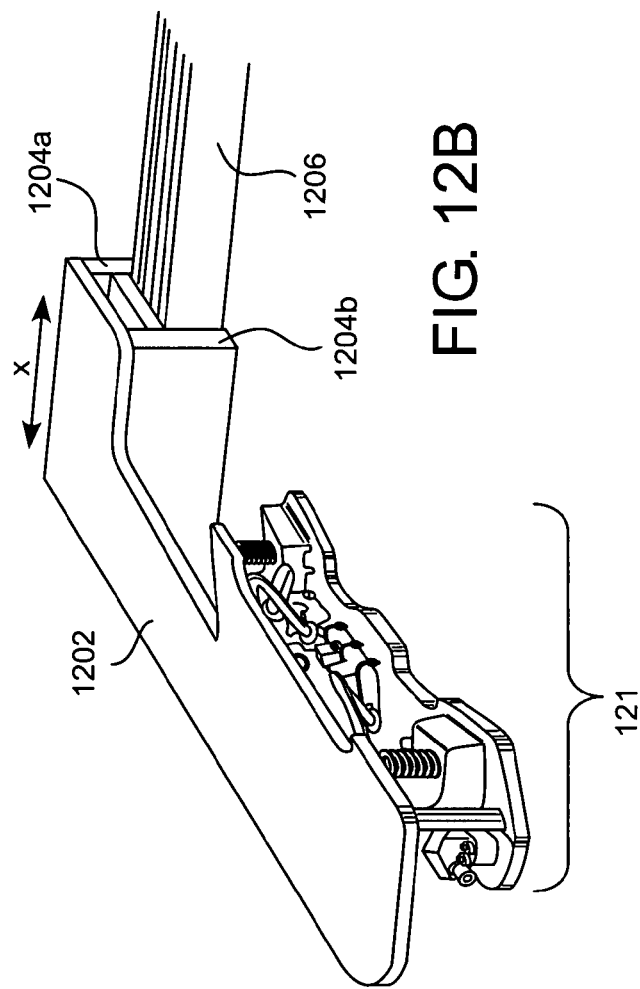

FIG. 12A and FIG. 12B are schematic illustrations of a transport system for moving the gripper assemblies in accordance with one embodiment of the present invention. Viewed from an end, gripper assembly 121 can be seen at the end of an arm 1202. The Arm 1202 can be coupled to guide 1204a and guide 1204b. The guides 1204a and 1204b can configure to restrict motion of the arm in a direction normal to a rail 1206. In one embodiment, the rail 1206 is part of a linear actuator that allows the arm 1202 to move in the direction X, as shown in FIG. 12B.

A moment is developed on the arm 1202 based on the mass of the gripper assembly and addition of a substrate when present in the gripper. Thus, the material and shape of the arm 1202 can be chosen based on its ability to resist deflection. As potentially corrosive process fluids may be used in close proximity to the arm 1202, an additional consideration is the chemical resistivity of a material for the arm 1202. In one embodiment, the arm 1202 is fabricated using American Society for Testing and Materials (ASTM) stainless steel type 316. In other embodiments, different materials such as plastic, non-ferrous metals, coated ferrous metals and alternate types of stainless steel may be used.

Figure 13:
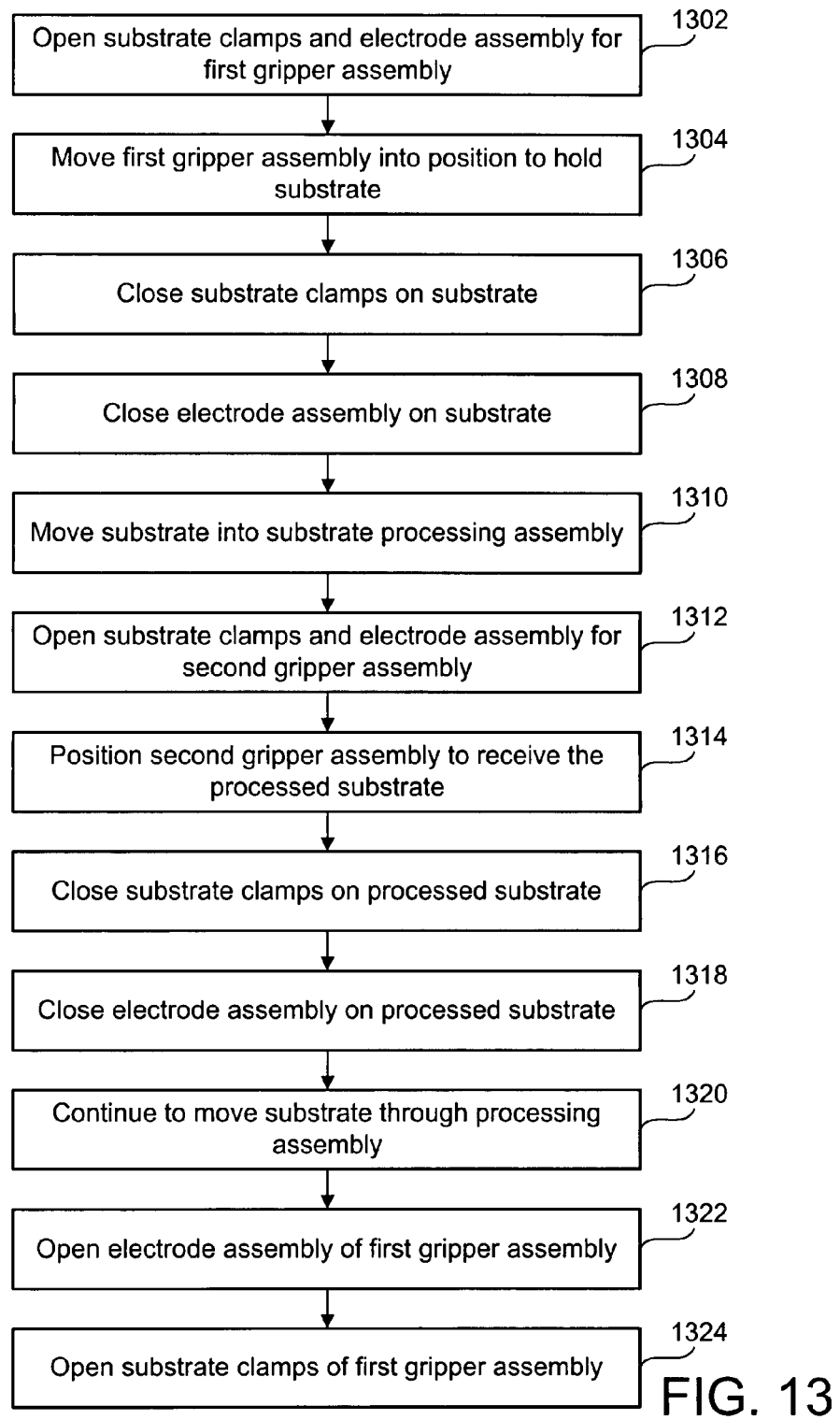
FIG. 13 is a flow chart illustrating a procedure that transport a substrate through a processing assembly in accordance with one embodiment of the present invention.

FIG. 13 is a flow chart illustrating a procedure that transport a substrate through a processing assembly in accordance with one embodiment of the present invention. The procedure begins with operation 1302 where the substrate clamps and electrode assembly for a first gripper assembly are placed in an open position. Operation 1304 is next and the first gripper assembly is moved into a position to hold the substrate. Next, operation 1306 closes the substrate clamps on the substrate, which is followed by operation 1308 that closes the electrode assembly on the substrate. The procedure continues with operation 1310 that moves the substrate into a substrate processing assembly. This is followed by operation 1312 where the substrate clamps and electrode assembly of the second gripper assembly are placed in an open position.

Operation 1814 is next and positions the second gripper assembly in a location to receive the substrate, as it emerges processed, from the process assembly. Once enough of the processed substrate has emerged from the process assembly, operation 1316 closes the substrate clamps of the second gripper assembly on the processed substrate. This is followed by operation 1318 where the electrodes assembly of the second gripper assembly is closed on the processed substrate. Operation 1320 continues the procedure as the first and second grippers continue to move the substrate through the process assembly. At a particular point, operation 1322 opens the electrode assembly of the first gripper assembly followed by operation 1324 that opens the substrate clamps of the first gripper assembly.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A substrate holding and transporting assembly, comprising:
   a base plate;
   a pair of clamps connected to the base plate in a spaced apart orientation, the spaced apart orientation being defined to enable support of a substrate with at least two independent points, the at least two independent points being defined by each of the pair of clamps; and
   an electrode assembly being connected to the base plate at a location that is substantially between the pair of clamps, the electrode assembly defined to impart an electrical contact to the substrate when present and held by the pair of clamps.

2. A substrate holding and transporting assembly as recited in claim 1, further comprising:
   a pair of clamp actuators being connected to the base plate and configured to maneuver the pair of clamps into an open position.

3. A substrate holding and transporting assembly as recited in claim 2, further comprising:
   an electrode actuator being connected to a top plate and configured to maneuver the electrode actuator into a closed position.

4. A substrate holding and transporting assembly as recited in claim 3, wherein the clamp actuators and the electrode actuator are independently controlled.

5. A substrate holding and transporting assembly as recited in claim 1, wherein the electrode assembly is defined to dispense a gas to the substrate when present.

6. A substrate holding and transporting assembly as recited in claim 1, wherein compression modules exert a constant pressure on the pair of clamps to hold the substrate when present.

7. A substrate holding and transporting assembly as recited in claim 6, wherein the compression modules are springs.

8. A method for clamping and applying an electrical contact to a substrate, comprising:
   providing a clamping assembly having an integrated electrode assembly in a receiving position capable of being independently actuated into a closed position and at least two substrate clamps in a receiving position, the substrate clamps capable of being independently actuated into a clamping position;
   receiving the substrate at the clamping assembly;
   actuating the substrate clamps into the clamping position, the clamping position placing the substrate clamps in contact with the substrate; and
   actuating the electrode assembly into a closed positioned, the closed position placing a plurality of electrodes of the electrode assembly in contact with the substrate, wherein the plurality of electrodes that are in contact with the substrate apply the electrical contact.

9. The method as recited in claim 8, wherein the electrode assembly further includes diffusers configured to dispense a gas to a top surface of the substrate when present.

10. The method as recited in claim 8, wherein a compression module positioned above the substrate clamp exerts a constant force on a top surface of the substrate clamp.

11. The method as recited in claim 10, wherein the compression module is a spring.

12. The method as recited in claim 8, wherein the actuating of the substrate clamps is performed pneumatically.

13. The method as recited in claim 8, wherein the actuating of the electrode assembly is performed pneumatically.

14. A substrate handling assembly, comprising:
   a base plate;
   a first substrate clamp coupled to the base plate and having a clamping face configured to hold and accommodate a substrate when provided, the first substrate clamp having an open position and a closed position, the closed position being defined to secure the substrate;
   a second substrate clamp coupled to the base plate and having a clamping face configured to hold and accommodate a substrate when provided, and the second substrate clamp is spaced apart by a clamping distance from the first substrate clamp along the base plate to define support for the substrate, the second substrate clamp having an open position and a closed position, the closed position being defined to secure the substrate; and
   an electrode assembly connected to the base plate at a location that is substantially between the first and second substrate clamps, the electrode assembly having a plurality of electrodes, the electrode assembly having an open position and a closed position, the closed position being defined to transition the plurality of electrodes toward the base plate and in contact with the substrate when present.

15. A substrate handling assembly as recited in claim 14, wherein each of the first substrate clamp, the second substrate clamp and the electrode assembly has an independent actuator.

16. A substrate handling assembly as recited in claim 14, wherein the electrode assembly further includes diffusers configured to dispense a gas to a top surface of a substrate when present.

17. A substrate handling assembly as recited in claim 14, further comprising:
   a compression module positioned above a top surface of the first substrate clamp;
   wherein when the first substrate clamp is in the closed position, the compression module exerts a constant force on the top surface of the first substrate clamp.

18. A substrate handling assembly as recited in claim 17, wherein the compression module is a spring.

19. A substrate handling assembly as recited in claim 14, wherein the first and second substrate clamps are made from a non-metallic material.

20. The substrate handling assembly as recited in claim 14, wherein the actuator is pneumatic.

* * * * *